US007512011B2

United States Patent
(12) Park

(10) Patent No.: US 7,512,011 B2

(45) Date of Patent: Mar. 31, 2009

(54) METHOD OF READING DATA IN A NON-VOLATILE MEMORY DEVICE

(75) Inventor: Seong Je Park, Sacheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 80 days.

(21) Appl. No.: 11/771,979

(22) Filed: Jun. 29, 2007

(65) Prior Publication Data

US 2008/0225600 A1 Sep. 18, 2008

(30) Foreign Application Priority Data

Mar. 14, 2007 (KR) ..................... 10-2007-0025108

(51) Int. Cl.
*G11C 11/34* (2006.01)

(52) U.S. Cl. ................................................ 365/185.25

(58) Field of Classification Search ............ 365/185.25, 365/185.18, 185.11

See application file for complete search history.

(56) References Cited

U.S. PATENT DOCUMENTS 5,754,475 A * 5/1998 Bill et al. ............... 365/185.25
7,352,618 B2 * 4/2008 Kim et al. .............. 365/185.02
7,372,730 B2 * 5/2008 Chen ..................... 365/185.02

FOREIGN PATENT DOCUMENTS

KR 1020020081079 A 10/2002
KR 1020050002245 A 1/2005
KR 1020050097595 A 10/2005

* cited by examiner

*Primary Examiner*—Anh Phung
(74) *Attorney, Agent, or Firm*—Townsend and Townsend and Crew LLP

(57) ABSTRACT

A method of reading data in a non-volatile memory device includes providing a plurality of blocks and a plurality of bit lines, each block having a plurality of memory cells, each block coupled to at least one bit line. First and second bit lines are discharged to be at a low level, the first bit line coupled to a first block, the second bit line coupled to a second block. A read voltage is applied to a first word line coupled to a memory cell to be read in the first block. A pass voltage is applied to a second word line coupled to a memory cell not to be read in the first block. The first bit line coupled to the memory cell to be read is precharged to a high level after applying the read voltage to the first word line and the pass voltage to the second word line. A voltage level of the first bit line is evaluated. Data stored in the memory cell to be read is sensed in accordance with the evaluated voltage level of the first bit line.

11 Claims, 5 Drawing Sheets

METHOD OF READING DATA IN A NON-VOLATILE MEMORY DEVICE

CROSS-REFERENCE TO RELATED APPLICATIONS

This application claims priority from Korean Patent Application No. 2007-025108, filed on Mar. 14, 2007, the contents of which are incorporated herein by reference in its entirety.

BACKGROUND OF THE INVENTION

The present invention relates to a method of reading data in a non-volatile memory device for reducing a read disturbance phenomenon.

Recently, the demand has increased for a non-volatile memory device which electrically programs and erases data and does not need to have a periodical refresh function.

The non-volatile memory device generally includes a memory cell array where memory cells for storing data are formed, and a page buffer for programming and reading data to/from a specific memory cell of the memory cell array.

The page buffer has a pair of bit lines connected to a certain memory cell, a register for temporarily storing data to be programmed to the memory cell array or reading data from a certain memory cell in the memory cell array and storing temporarily the read data, a sensing node for sensing a bit line or a voltage level of the register, and a bit line selecting section for controlling the connection between the bit line and the sensing node.

In the above read operation of the non-volatile memory device, a first voltage is applied to a bit line connected to a cell string having a certain memory cell, and a second voltage is provided to a bit line not connected to the cell string. Here, the second voltage is different from the first voltage.

In the case that a read voltage Vread is applied to a word line of a first memory cell related to the bit line not connected to the cell string during the read operation is performed, a hot carrier injection phenomenon can occur to a second memory cell adjacent to the first memory cell. As a result, a read disturbance phenomenon may occur to the non-volatile memory device due to the hot carrier injection phenomenon.

SUMMARY OF THE INVENTION

The present invention relates to a method of reading data for preventing a read disturbance phenomenon during a read operation is performed in a non-volatile memory device.

A method of reading data in a non-volatile memory device according to one example embodiment of the present invention includes discharging bit lines to low level; applying a read voltage or a pass voltage to a word line coupled to a memory cell; precharging the bit line coupled to a memory cell to be read to high level; evaluating a voltage level of the bit line; and sensing data stored in the memory cell in accordance with the evaluated voltage level of the bit line.

A method of reading data in a non-volatile memory device according to another example embodiment of the present invention includes discharging bit lines to low level; providing a drain selecting signal having high level and a source selecting signal having high level when a read voltage or a pass voltage is applied to a word line coupled to a memory cell; precharging the bit line coupled to a specific memory cell to be read to high level; evaluating a voltage level of the bit line; and sensing data stored in the specific memory cell in accordance with the evaluated voltage level of the bit line.

As described above, a method of reading data of the present invention prevents a hot carrier injection phenomenon from being occurred to a memory cell located at a periphery of a memory cell to be read. Hence, a threshold voltage of the memory cell located at the periphery is changed, and so a read disturbance phenomenon may be not occurred.

DESCRIPTION OF SPECIFIC EMBODIMENTS

Hereinafter, the embodiments of the present invention will be explained in more detail with reference to the accompanying drawings.

Figure 1:
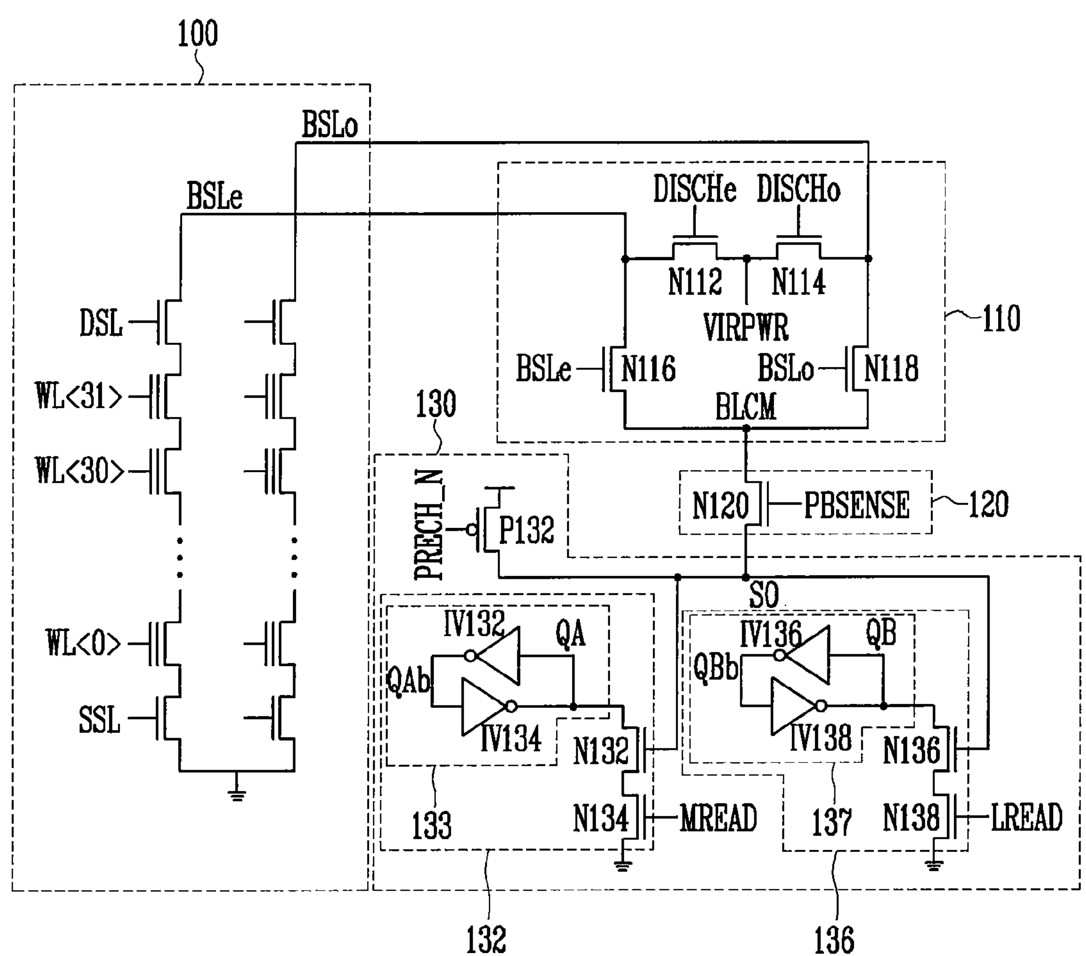
FIG. 1 is a view illustrating a non-volatile memory device according to an embodiment of the present invention.

In FIG. 1, the non-volatile memory device of the present embodiment includes a memory cell array 100, an even bit line BLe and an odd bit line BLo coupled to the memory cell array 100, a register unit 130 having a first register 132 and a second register 136 for storing specific data, a sensing node SO coupled to the bit lines BLe, BLo and the registers 132, 136, a bit line selecting section 110 for coupling selectively the even bit line BLe or the odd bit line BLo to a bit line common node BLCM, and a bit line sensing section 120 for coupling the sensing node SO to the bit line common node BLCM in response to a bit line sensing signal PBSENSE.

The memory cell array 100 includes memory cells for storing data, word lines for activating the memory cells, and the bit lines BLe and BLo through which data in the memory cell are inputted or outputted. Here, the word lines and the bit lines are disposed in a matrix shape.

The memory cell array 100 has memory cells coupled in series between a source select transistor SSL and a drain select transistor DSL, i.e., a cell string structure.

The gates of the memory cells are coupled to the word lines. Here, a group of memory cells coupled in common to the same word line form a page. In addition, cell strings coupled to each of the bit lines form a block, wherein the cell strings are coupled in parallel to a common source line.

The bit line selecting section 110 includes an N-MOS transistor N116 for coupling the even bit line BLe to the bit line common node BLCM in response to a first bit line selecting signal BSLe, and an N-MOS transistor N118 for coupling the odd bit line BLo to the bit line common node BLCM in response to a second bit line selecting signal BSLo.

Additionally, the bit line selecting signal 110 has a control signal input terminal for providing a control signal VIRPWR having a certain level, an N-MOS transistor N112 for coupling the even bit line BLe to the control signal input terminal in response to a first discharge signal DISCHe, and an N-MOS transistor N114 for coupling the odd bit line BLo to the control signal input terminal in response to a second discharge signal DISCHo.

The bit line sensing section 120 couples the bit line common node BLCM to the sensing node SO in response to a bit line sensing signal PBSENSE, and provides the voltage level of data stored in a certain memory cell to the sensing node SO in accordance with a voltage level of the memory cell bit line. Here, the sensing signal PBSENSE has a first voltage V1 or a second voltage V2 smaller than the first voltage V1.

In another embodiment of the present invention, the memory device does not include the bit line sensing section 120. That is, the bit line selecting section 110 may be directly coupled to the sensing node SO. In this case, the bit line selecting signal BSLe or BSLo having the first voltage V1 or the second voltage V2 is provided to the N-MOS transistor N116 or N118, and so a voltage level of data stored in a certain memory cell is provided to the sensing node SO in accordance with the voltage level of a given bit line.

The register unit 130 includes a P-MOS transistor P132 for coupling the sensing node SO to a power supply voltage in response to a precharge signal PRECH_N, and the first and second registers 132 and 136 for storing data temporarily.

The first register 132 has a first latch 133 which includes inverters IV132 and IV134, an N-MOS transistor N132 coupled to a first node QA of the first latch and turned on in response to a voltage level of the sensing node SO, and an N-MOS transistor N134 coupled between the N-MOS transistor N132 and a ground voltage and turned on in response to a read signal MREAD.

The second register 136 includes a second latch 137 which includes inverters IV136 and IV138, an N-MOS transistor N136 coupled to a first node QB of the second latch and turned on in response to the voltage level of the sensing node SO, and an N-MOS transistor N138 coupled between the N-MOS transistor N136 and the ground voltage and turned on in response to a read signal LREAD.

Figure 2:
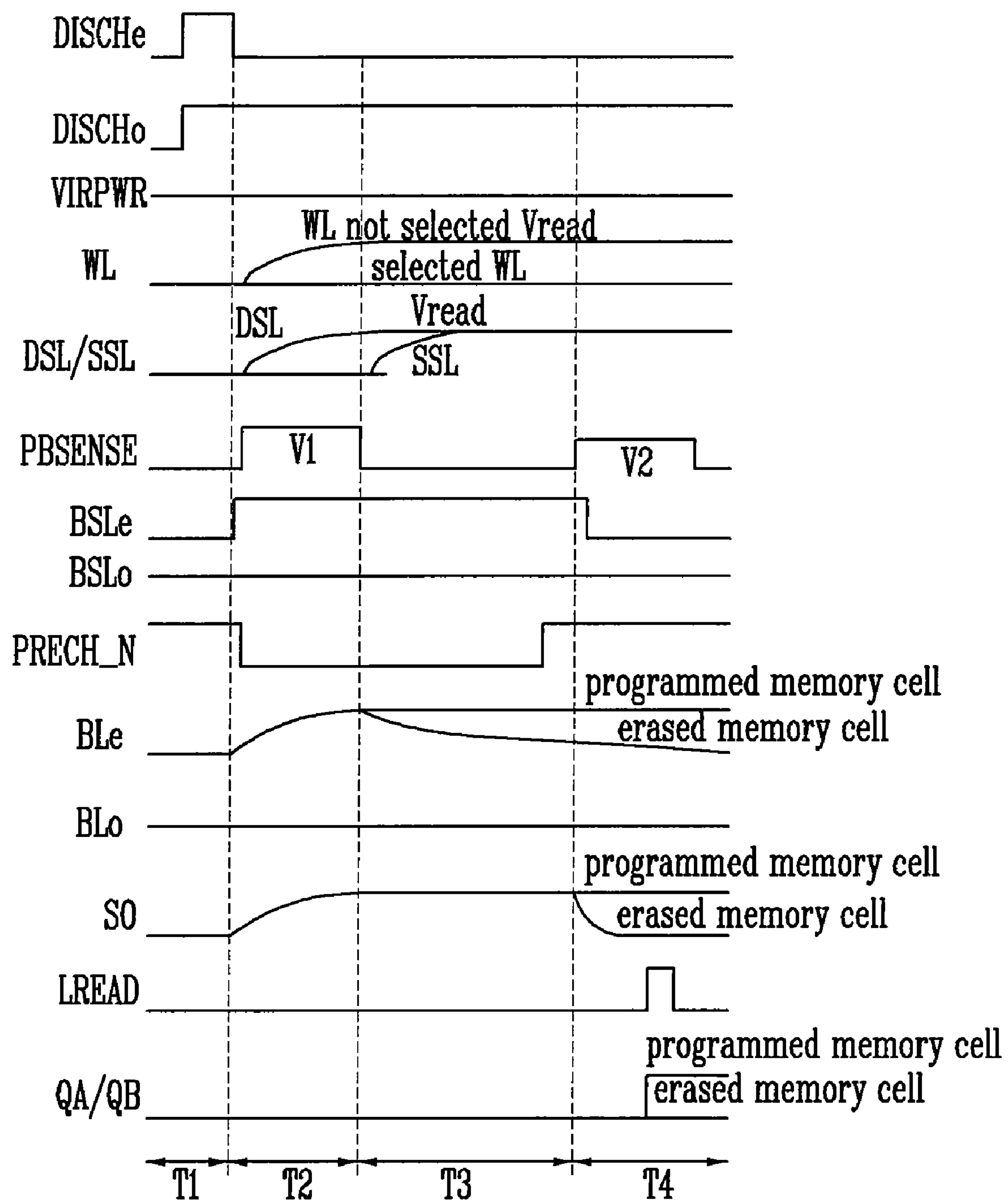
FIG. 2 is a timing diagram illustrating a waveform of signals when a conventional read operation is performed in the non-volatile memory device.

FIG. 2 is a timing diagram illustrating a waveform of signals when a conventional read operation is performed in the non-volatile memory device.

(1) T1 Interval

A bit line is discharged before the cell string having a specific memory cell to be read is coupled to a corresponding bit line.

The N-MOS transistor N112 is turned on by enabling the even discharge signal DISCHe for a given time. In this case, since the bias voltage VIRPWR has a low level, the even bit line BLe is discharged to a voltage having a low level.

In addition, the N-MOS transistor N114 is turned on by enabling the odd discharge signal DISCHo, and thus the odd bit line BLo is also discharged to a voltage having a low level.

(2) T2 Interval

The sensing node SO is precharged to a high level. Particularly, the transistor P132 is turned on for a given time, and so the sensing node SO is precharged to a high level.

Subsequently, the voltage Vread having a high level is applied to a drain select line DSL, and so the cell string having the memory cell to be read is coupled to a certain bit line.

Further, a read voltage having a specific level is applied to a word line related to the selected memory cell, and the voltage Vread having a high level is provided to a word line related to the memory cell not selected. On the other hand, in FIG. 2, the read voltage of 0V is applied to the word line related to the selected memory cell.

Then, the bit line common node BLCM is coupled to the sensing node SO by providing the bit line sensing signal PBSENSE having a high level V1 to the transistor N120. In this case, the bit line selecting signal BSLe or BSLo having a high level is transmitted to a bit line to be read, and so the bit line BLe or BLo is coupled to the bit line common node BLCM. Accordingly, the voltage level of the bit line BLe or BLo is increased to a high level in accordance with the voltage level of the sensing node SO.

(3) T3 Interval

The voltage Vread having a high level is applied to the source select transistor SSL, and so the cell string having the specific memory cell of the memory cell array 100 is coupled to the common source line. As a result, a current path is formed between the bit line and the common source line.

Subsequently, the bit line sensing signal PBSENSE is converted from a high level into a low level, and so the bit line and the sensing node SO are disconnected for a certain time. As a result, the voltage level of the bit line coupled to a corresponding memory cell is changed in accordance with a program state of the cell.

In other words, in the case that the memory cell is programmed, a threshold voltage of the memory cell is increased. Hence, no current passes through the above current path, and so the voltage level of the bit line is maintained. However, in the case that the memory cell is not programmed (i.e., an erased cell) a current passes through the current path, and so the voltage level of the bit line is discharged to a low level.

In addition, the precharge signal PRECH_N is converted from a low level to a high level before a following interval T4, and so the connection between the sensing node SO and the power supply voltage is turned off.

(4) T4 Interval

The bit line sensing signal PBSENSE is converted from a low level into a high level, and so a corresponding bit line is coupled to the sensing node SO for a given time.

The voltage level of the sensing node SO is determined in accordance with a voltage level of the bit line. Here, since the sensing node SO maintains a high level in the case that a corresponding memory cell is programmed, the N-MOS transistor N136 of the second register 136 is turned on. In this case, the signal LREAD having a high level is transmitted to the N-MOS transistor N138 of the second register 136, and so data having a low level are stored in the second node QB in the case that the memory cell is programmed.

On the other hand, the register unit for storing data related to the program may be changed in according to the implementation of a user.

Data stored in the memory cell are read through the above process.

As mentioned above, the memory device may not include the bit line sensing section 120 according to the implementation of a user. That is, the bit line selecting section 110 is directly coupled to the sensing node SO, and this structure is known.

In this case, the bit line selecting signal BSLe or BSLo instead of the bit line sensing signal PBSENSE is provided with the first voltage V1 or the second voltage V2, and so that the voltage level of the bit line can be evaluated. Then, a voltage level of data stored in a certain memory cell is provided to the sensing node SO in accordance with the evaluated voltage level of the bit line.

In the conventional read operation, a threshold voltage of a memory cell located at a periphery of a memory cell to be read can be changed. Accordingly, the memory device of the present invention improves a phenomenon where the threshold voltage of the memory cell is changed.

Hereinafter, a process of preventing a read disturbance phenomenon will be described in detail with reference to accompanying drawings.

Figure 3:
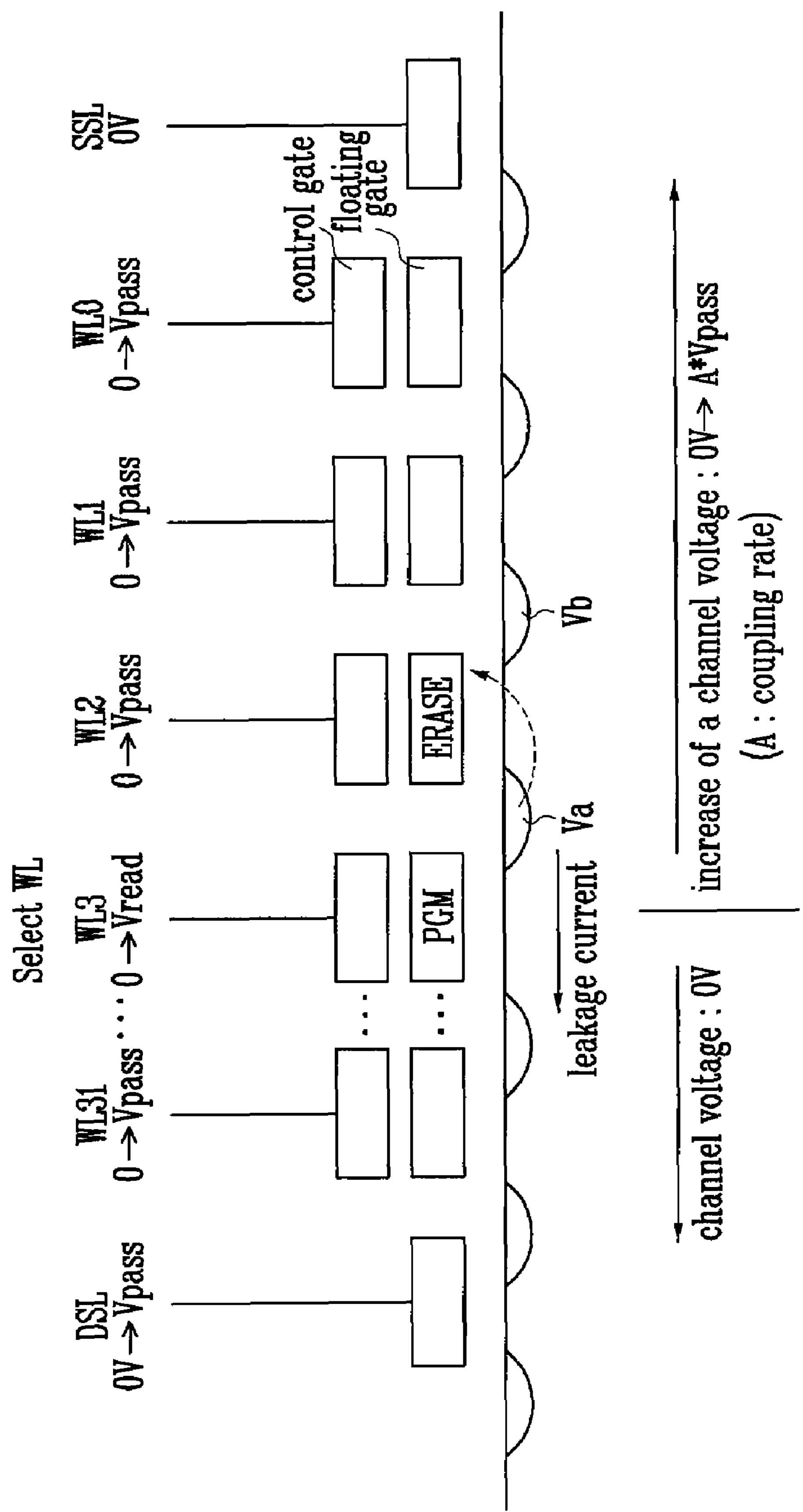
FIG. 3 is a view illustrating a read disturbance phenomenon in the common read operation of the non-volatile memory device.

FIG. 3 is a view illustrating a read disturbance phenomenon in the common read operation of the non-volatile memory device.

FIG. 3 shows a side view illustrating a structure of the cell string in which 32 memory cells are coupled in series.

A control gate of the memory cell is directly coupled to a word line WLn (where n is a variable). In addition, a floating gate of the memory cell is located under the control gate.

Hereinafter, the cell string is assumed to be in a state prior to being read. Hence, the discharge signal DISCHe or DISCHo having a high level is provided to the transistor N112 or N114 during the intervals T1 to T4 shown in FIG. 2, and so a corresponding bit line has a low level.

Additionally, it is assumed that a memory cell coupled to a word line WL3 is a programmed cell PGM, and a memory cell coupled to a word line WL2 adjacent to the word line WL3 is an erased cell ERASE.

In this case, in the T2 interval of FIG. 2, memory cells (cells coupled to word lines WL31 to WL4) located between the selected memory cell and the drain select transistor DSL maintain a low level. However, in memory cells (cells coupled to word lines WL2 to WL0) located between the selected cell and the source select transistor SSLare in a floating state.

Under this condition, in the case that the voltage of the word line is increased up to the read voltage Vread or the pass voltage Vpass, the voltage of the channel in a floating state is increased by a coupling rate.

In this case, current is leaked from a drain of a memory cell (a cell coupled to the word line WL2) adjacent to the selected memory cell, and so a voltage is applied to a corresponding bit line. As a result, a hot carrier injection phenomenon occurs to the memory cell (cell coupled to the word line WL2) adjacent to the selected memory cell. In addition, some of electrons are injected into the floating gate in accordance with the hot carrier injection phenomenon. This results in an increase of the threshold voltage of the adjacent memory cell and thus a read disturbance phenomenon.

Figure 4:
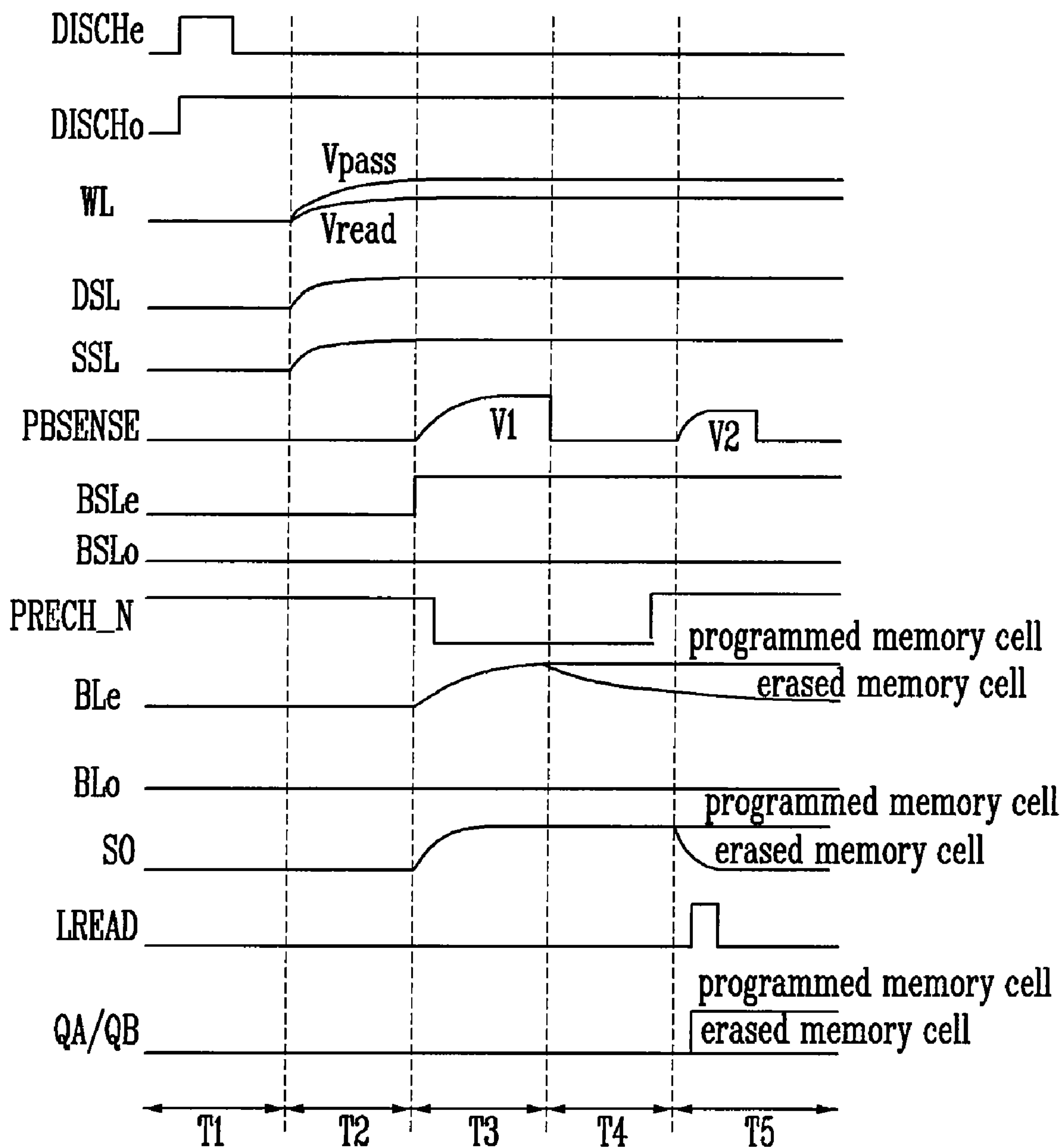
FIG. 4 is a timing diagram illustrating a waveform of signals in a read operation of a non-volatile memory device according to an embodiment of the present invention.

FIG. 4 is a timing diagram illustrating a waveform of signals in a read operation of a non-volatile memory device according to an embodiment of the present invention.

(1) T1 Interval

A bit line is discharged to a low level before the cell string having a specific memory cell to be read is coupled to a corresponding bit line.

The N-MOS transistor N112 is turned on by enabling the even discharge signal DISCHe for a given time. In this case, since the bias voltage VIRPWR has a low level, the even bit line BLe is discharged to a low level of a voltage.

In addition, the N-MOS transistor N114 is turned on by enabling the odd discharge signal DISCHo, and thus the odd bit line BLo is also discharged to a low level.

(2) T2 Interval

A given level of a voltage is applied to a word line before the bit line is precharged to a high level, and so a gate voltage of the memory cell is increased.

The read voltage Vread is applied to word lines associated with a memory cell to be read, and the pass voltage Vpass is provided to the other word lines. Here, since the voltage of the word line is increased before the bit line is precharged, a channel voltage of the cell string is not increased. The pass voltage is 3V to 5V, and the read voltage Vread is 0V in the present embodiment. But, the values of voltage can be easily changed by the skilled person in the art.

On the other hand, the drain selecting signal DSL having a high level and the source selecting signal SSL having a high level are applied to corresponding transistors. Here, the drain selecting signal DSL turns on the drain select transistor, and the source selecting signal SSL turns on the source select transistor.

In the present implementation, the signals DSL and SSL of the high level are applied at substantially the same time, so that the memory cells located between the selected memory cell and the source select transistor (e.g., the cells in a selected cell string) do not have a floating state.

(3) T3 Interval

The bit line coupled to the memory cell to be read is precharged to a high level by precharging the sensing node SO to a high level. Here, the sensing node SO is precharged to a high level by turning on the transistor P132 for a given time. The transistor P132 is a PMOS and is turned on by a low voltage in the present embodiment.

Subsequently, the bit line sensing signal PBSENSE having a high level V1 is transmitted to the transistor N120, and so the bit line common node BLCM is coupled to the sensing node SO.

In this case, the bit line selecting signal BSLe or BSLo having a high level is provided to the transistor N116 or N118 related to a specific bit line to be read, and so the bit line BLe or BLo is coupled to the bit line common node BLCM. As a result, the voltage level of the bit line BLe or BLo is increased in accordance with the voltage level of the sensing node SO.

On the other hand a voltage of a low level is provided to the bit line BLo coupled to a memory cell except the memory cell to be read.

(4) T4 Interval

The bit line sensing signal PBSENSE is converted from a high level into a low level, and so a corresponding bit line and the sensing node SO is decoupled (or disconnected) for a given time.

The voltage level of the bit line coupled to a corresponding memory cell is changed for the given time in accordance with the program state of the specific memory cell.

That is, the threshold voltage of the memory cell is increased in the case that the specific memory cell is programmed, and so no current is passed through the current path. As a result, the voltage level of the bit line is maintained. However, in the case that the memory cell is not programmed (i.e., an erased cell), a certain current is passed through the current path, and so the voltage level of the bit line is discharged to a low level.

Then, the precharge signal PRECH_N is converted from a low level into a high level before a T5 interval is progressed, and so a connection between the sensing node SO and a power supply voltage is turned off.

(5) T5 Interval

The bit line sensing signal PBSENSE is converted from a low level into a high level V2, and so a corresponding bit line is coupled to the sensing node SO for a certain time.

The voltage level of the sensing node SO is determined in accordance with the voltage level of the bit line. Here, since the sensing node SO maintains a high level in the case that a corresponding memory cell is programmed, the N-MOS transistor N136 of the second register 136 is turned on. In this case, the signal LREAD having a high level is provided to the N-MOS transistor M138 of the second register 136, and so a low level is stored in the second node QB.

Data stored in the memory cell are read through the above process.

As mentioned above, the memory device may not include the bit line sensing section 120 in accordance with a selection of a user. That is, the bit line selecting section 110 may be directly coupled to the sensing node SO.

In this case, the bit line selecting signal BSLe or BSLo instead of the bit line sensing signal PBSENSE is transmitted with the first voltage V1 or the second voltage V2, and so the voltage level of the bit line can be evaluated. Then, a voltage level of data stored in a certain memory cell is provided to the sensing node SO in accordance with the evaluated voltage level of the bit line.

Figure 5:
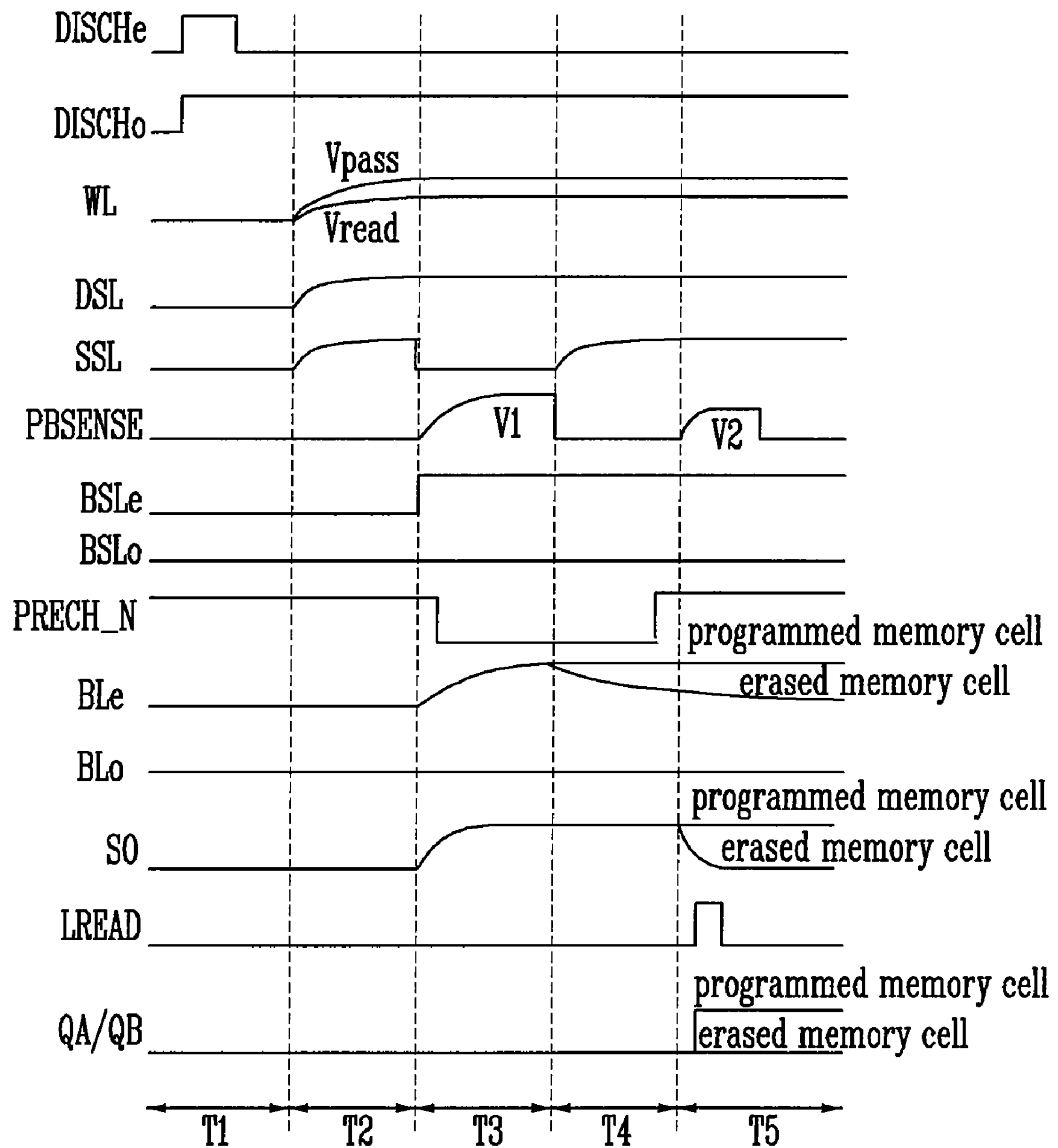
FIG. 5 is a timing diagram illustrating a waveform of signals in a read operation of the non-volatile memory device according to another embodiment of the present invention.

FIG. 5 is a timing diagram illustrating a waveform of signals in a read operation of the non-volatile memory device according to another embodiment of the present invention.

In the present embodiment like the embodiment in FIG. 4, the voltage of the word line is increased before the bit line is precharged to a high level, and the drain selecting signal DSL and the source selecting signal SSL are simultaneously provided.

However, the source selecting signal SSL is provided with a low level for a certain time. Here, the source selecting signal SSL is transmitted with a high level for the other time.

In FIG. 5, the source selecting signal SSL having a low level is provided for the T3 interval in which the bit line is precharged to a high level.

In this case, since an interval in which the voltage of the word line is increased is finished, the hot carrier injection phenomenon does not occur to the memory device though the source selecting signal SSL having a low level is provided.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of reading data in a non-volatile memory device, the method comprising:

providing a plurality of blocks and a plurality of bit lines, each block having a plurality of memory cells, each block coupled to at least one bit line;

discharging first and second bit lines to be at a low level, the first bit line coupled to a first block, the second bit line coupled to a second block;

applying a read voltage to a first word line coupled to a memory cell to be read in the first block;

applying a pass voltage to a second word line coupled to a memory cell not to be read in the first block;

precharging the first bit line coupled to the memory cell to be read to a high level after applying the read voltage to the first word line and the pass voltage to the second word line;

evaluating a voltage level of the first bit line; and sensing data stored in the memory cell to be read in accordance with the evaluated voltage level of the first bit line.

2. The method of claim 1, wherein a drain select signal having a high level is applied to a drain select transistor of the first block and a source select signal having a high level is applied to a source select transistor of the first block while applying the read voltage and the pass voltage.

3. The method of claim 2, wherein the drain select signal and the source select signal are applied to the drain select transistor and the source select transistor prior to commencing the precharging of the first bit line.

4. The method of claim 1, wherein a low voltage is provided to the second bit line coupled to the second block.

5. The method of claim 1, wherein the non-volatile memory is a NAND flash memory device.

6. The method of claim 2, wherein the source select signal is in a low level at least partly while the bit line is being precharged to a high level.

7. A method of reading data in a non-volatile memory device, the method comprising:

at a first time period, discharging first and second bit lines, the first bit line and second bit line coupled to a first block and a second block, respectively, each block including a plurality of memory cells;

at a second time period, providing a drain select signal to enable a drain select transistor of the first block and a source select signal to a source select transistor of the first block; and at a third time period, precharging the first bit line coupled to a memory cell to be read to a high level, the first bit line coupled to the first block, wherein data stored in the memory cell to be read is determined by evaluating a voltage level of the bit line.

8. The method of claim 7, further comprising:

at the second time period, applying a read voltage to a word line coupled to the memory cell to be read and a pass voltage is applied to a word line coupled to a memory cell not to be read.

9. The method of claim 7, wherein a low voltage is provided to the second bit line coupled to the second block.

10. The method of claim 7, wherein the first, second and third time periods are different time periods.

11. The method of claim 7, wherein the source select signal maintains a low level at least partly while the bit line is being precharged to a high level.

* * * * *